(12) United States Patent
Oh et al.

(10) Patent No.: US 8,815,399 B2
(45) Date of Patent: Aug. 26, 2014

(54) CARBON NANOTUBE CONDUCTIVE LAYER USING SPRAY COATING AND PREPARING METHOD THEREOF

(75) Inventors: Sang Keun Oh, Seongnam-si (KR); Kyoung Hwa Song, Seoul (KR); Da Jeong Jeong, Suwon-si (KR); Do Hyeong Park, Suwon-si (KR); Dong-Myeon Lee, Pyeongtaek-si (KR)

(73) Assignee: Top Nanosys, Inc., Gwangju-si (KR)

( * ) Notice: Subject to any disclaimer, the term of this patent is extended or adjusted under 35 U.S.C. 154(b) by 397 days.

(21) Appl. No.: 12/682,363

(22) PCT Filed: Oct. 9, 2008

(86) PCT No.: PCT/KR2008/005921
§ 371 (c)(1),
(2), (4) Date: Apr. 9, 2010

(87) PCT Pub. No.: WO2009/048269
PCT Pub. Date: Apr. 16, 2009

(65) Prior Publication Data
US 2010/0221531 A1 Sep. 2, 2010

(30) Foreign Application Priority Data
Oct. 12, 2007 (KR) .................. 10-2007-0103258

(51) Int. Cl.
*B32B 9/00* (2006.01)

(52) U.S. Cl.
USPC ...................... 428/408; 423/448; 977/742

(58) Field of Classification Search
USPC .............. 428/408; 423/447.1, 447.2; 977/742
See application file for complete search history.

(56) References Cited

U.S. PATENT DOCUMENTS

2004/0265550 A1* 12/2004 Glatkowski et al. .......... 428/209

FOREIGN PATENT DOCUMENTS

| JP | 2006-310154 | 11/2006 |
|---|---|---|
| KR | 10-1999-0045948 | 6/1999 |
| KR | 10-2006-0084666 | 7/2006 |
| WO | WO 2004/052559 | 6/2004 |

OTHER PUBLICATIONS

International Search Report issue in PCT/KR2008/005921 dated May 27, 2009.

* cited by examiner

*Primary Examiner* — Daniel H Miller
(74) *Attorney, Agent, or Firm* — KED & Associates LLP

(57) ABSTRACT

Provided is a carbon nanotube (CNT) transparent conductive layer having a loop pattern in which a plurality of loops are at least partially connected to one another, and a fabrication method thereof. The loops in the pattern are generated by a spray-coating method and partially connected with one anther, and thus improving transparency and conductivity of the CNT transparent conductive layer. In Addition, the CNT transparent conductive layer has conductivity and sheet resistance highly suitable for a transparent electrode.

8 Claims, 3 Drawing Sheets

CARBON NANOTUBE CONDUCTIVE LAYER USING SPRAY COATING AND PREPARING METHOD THEREOF

TECHNICAL FIELD

The present invention relates to a carbon nanotube (CNT) transparent conductive layer fabricated by spray-coating and a fabrication method thereof, and more particularly, to a CNT transparent conductive layer which has a spray pattern with high conductivity and transparency created thereon by adjusting a shape of the pattern while a base is coated with a carbon nanotube solution.

BACKGROUND ART

A carbon nanotube (CNT) consists of a plurality of carbon atoms arranged in a tube. The carbon atoms are arrayed in a hexagonal lattice, similar to a honeycomb. A diameter of the tube is as small as a nanometer, and has unique electrical, chemical properties.

The carbon nanotube has advantageous mechanical properties, electrical selectivity, and remarkable field emission properties. The carbon nanotube may have semi-conductor properties according to arrangement of the carbon atoms, and the energy gap of the nanotube varies depending on the size of diameter of the nanotube. For these reasons, there has been increasing interest in the carbon nanotubes in electronic, biotechnology and medical fields. Additionally, electrical properties of the carbon nanotube are incomparably more beneficial than any other materials known so far. When a thin conductive layer is formed on a plastic or glass substrate by coating the substrate with the carbon nanotubes, the substrate may have high conductivity and transparency in a visible light range, and thus can be used as a transparent electrode. Such a carbon nanotube (CNT) transparent electrode is attracting attention as a substitute for an indium tin oxide (ITO) transparent electrode which is conventionally employed for a field emission display (FED) flat panel display (FPD) or a touch panel.

Especially, a CNT transparent electrode coated on a plastic substrate is more resilient to an external impact or stress than an ITO transparent electrode which is a metal oxide thin layer, and thus the electronic properties of the CNT transparent electrode are not easily changed even when the substrate is bent or folded. Accordingly, the CNT transparent electrode has been studied as a transparent electrode for a flexible display which is regarded as a next-generation display.

To utilize the carbon nanotubes as a transparent electrode, a dispersed carbon nanotube solution needs to be coated on a given base. Well known coating methods such as spray coating, deep coating, spin coating, and roll coating have been used conventionally. Coating methods described in U.S. Pat. No. 7,118,693 and U.S. Pat. No. 7,060,241 relate to coating methods generally used for coating solutions to be coated on a base.

To optimize condtutivity and transparency for a coated CNT transparent electrode, types of carbon nanotubes to be coated are selected, additives are added to enhance the condtutivity, and the thickness of the coating solution to be disposed on the base is adjusted.

However, even when the method described above is employed to the fabrication of the CNT transparent conductive layer, the CNT transparent conductive layer does not retain satisfactory transparency and condtutivity, and thus there are still a lot of aspects of the CNT transparent conductive layer to be improved.

DISCLOSURE OF INVENTION

Technical Problem

The present invention is to provide a carbon nanotube (CNT) transparent conductive layer having condtutivity and transparency improved by use of a particular shape of a pattern created on a base using a spray-coating method, and a fabrication method thereof.

Technical Solution

According to an aspect of the present invention, there is provided a CNT transparent conductive layer having a pattern in which a plurality of loops at least partially connected with one another.

According to another aspect of the present invention, there is provided a method of fabricating a CNT transparent conductive layer, the method comprising: preparing a coating solution by mixing and dispersing carbon nanotubes, a dispersing agent and a solvent; and spraying the coating solution onto a base at a pressure of from 0.05 to 60 kgf/cm$^2$, and drying up the coated base.

Additional features of the invention will be set forth in the description which follows, and in part will be apparent from the description, or may be learned by practice of the invention.

Advantageous Effects

A loop pattern in which a plurality of loops which are created by a spray-coating method and are at least partially connected with one another allows a CNT transparent conductive layer to have significantly improved transparency and conductivity. Such the CNT transparent conductive layer has condtutivity and sheet resistance characteristics which are highly suitable for a transparent electrode. In addition, the loop pattern is generated spontaneously by use of spraying, which simplifies the procedures for generating the pattern without several steps of preprocessing. As the result, the CNT transparent conductive layer in accordance with the present invention is industrially advantageous.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

MODE FOR THE INVENTION

Figure 1:
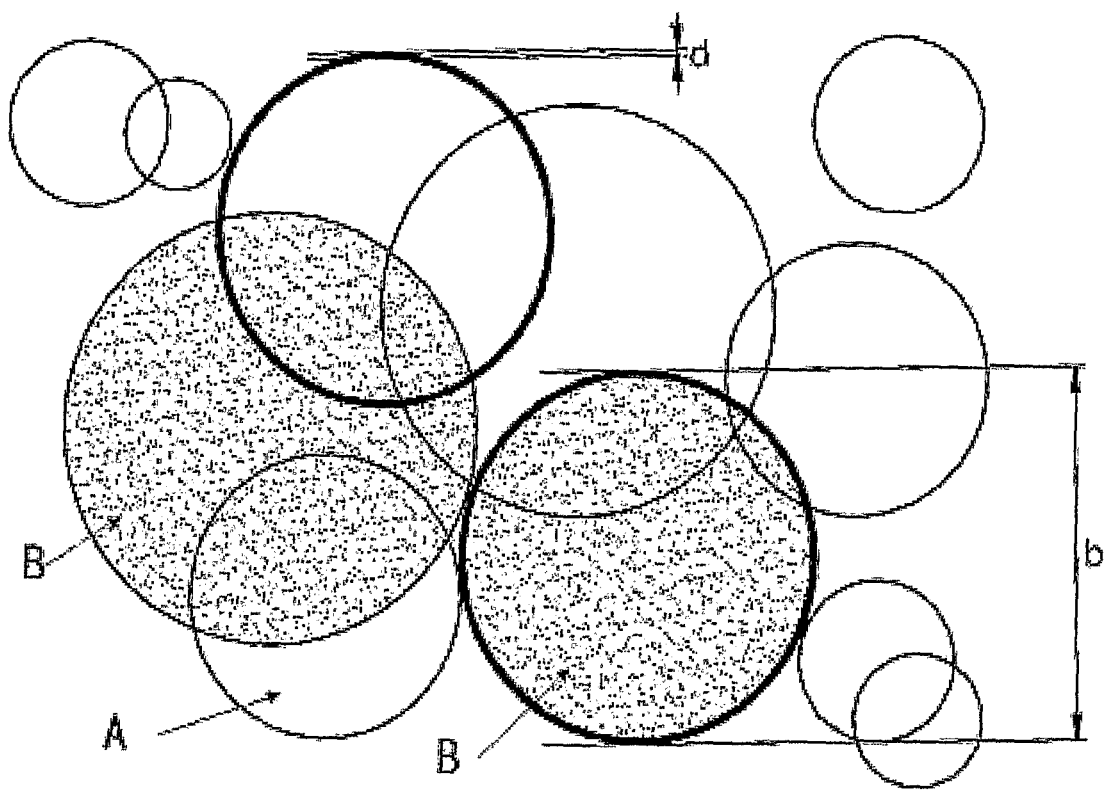
FIG. 1 is a view for explaining a circular loop pattern according to an exemplary embodiment.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

A carbon nanotube conductive layer which is available to maintain transparency and condtutivity of a transparent electrode may be applied to the transparent electrode. For maintenance of the transparency and conductivity of the transparent electrode, following conditions need to be met.

First, carbon nanotubes that are conductive materials need to be bonded together without disconnection. Since electricity should flow through an electrode, the carbon nanotubes having condtutivity need to be linked together without disconnection. For example, to make electricity flow throughout a large area of the electrode, the conductive carbon nanotubes are required to be bonded together over the whole surface of the electrode. The easiest method for implementing this connection is to apply conductive material onto the entire base. The coating may be advantageous in improving the conductivity of the transparent electrode, but may cause deterioration of the transparency which is one of characteristics of the transparent electrode.

Second, to increase the transparency of the transparent electrode, conductive carbon nanotubes need to be coated as thinly as possible over the whole or the part of the base.

To satisfy the two above-described characteristics, a spray coating method is employed to form a carbon nanotube (CNT) transparent conductive layer on which a pattern consisting of a plurality of loops either partially or entirely connected with each other is created. The loop pattern can be observed by optical microscopy or scanning electron microscopy (SEM).

The loops of the loop pattern to be described in the embodiments may vary in their shape. The loops of the pattern may be oval or circle.

According to the spray-coating method in accordance with the exemplary embodiment, a solution in the form of fine particles is sprayed onto a base at a constant pressure to induce the fine particles to evaporate, and consequently a specific pattern, that is, a loop pattern, is remained on the base. Especially, a circular loop pattern, for example, a coffee-ring shaped loop pattern may bring about a transparent electrode with high transparency and low sheet resistance.

The coffee-ring shaped loop pattern is obtained by evaporating a solution in which fine particles are dispersed. This term of the coffee-ring comes from a coffee stain which is left behind coffee has been spilt on a surface of an object and is normally in a circular shape. When liquid droplets are mixed with particles that have a different evaporation speed from the liquid, the liquid at the edge of the droplet evaporates, and the center liquid moves toward the edge to fill the space. Consequently most particles inside the center liquid are converged on the edge of the droplet, resulting in the coffee-ring shaped pattern.

According to the exemplary embodiment, parameters such as a pressure of spraying coating solution, and a temperature of a base on which a CNT transparent conductive layer is to be formed may be under control to create a circular loop pattern, for example, a coffee-ring shaped pattern in which the coffee-ring shaped loops are of constant size and shape. In addition, by controlling such parameters, a CNT transparent electrode may be obtained, which has high transparency and carbon nanotubes connected with one another without disconnection therebetween.

FIG. 1 is a view for explaining a circular loop pattern according to an exemplary embodiment. However, the loop shape of the pattern is not necessarily limited to the circle shown in FIG. 1.

Referring to FIG. 1, a pattern including a plurality of circular loops is formed on a CNT transparent conductive layer which is fabricated by a method in accordance with the exemplary embodiment. The loops are connected with one another, and as shown in FIG. 1, there are overlapping regions caused by the connections between the loops. Also, spaces inside the loops represented by a reference character B are filled with a coating solution. Although the spaces B inside the loops appear fully filled in FIG. 1, in practice, insides of the loops are only partially filled with the solution. High conductivity and transparency may be achieved by maintaining the space A of the loop partially empty while the loops are connected with one another. Besides the overlapping regions of the loops, increase in inner spaces of the loops which are filled with the solution may result in deterioration of transparency of the CNT transparent conductive layer.

According to the exemplary embodiment, the circular loops of the pattern may be not or partially taken up with other materials.

In FIG. 1, a reference character d represents a thickness of a loop, and b represents an external diameter of the loop. The size of the loop pattern is determined by the thickness d and the external diameter b.

According to the exemplary embodiment, the size of the loop pattern varies according to nozzles and a spraying pressure in the course of spray-coating a base. For example, the outer diameter b of a loop may be between 0.1 and 120 m, and the thickness d of the loop may be between 0.01 and 5 m.

If the diameter of the loop exceeds the range identified above, uniformity of the sheet resistance of the transparent conductive layer decreases, and if the diameter is smaller than the identified range, the transparency is deteriorated by small sized loops which fill the inner spaces of bigger loops.

Furthermore, if the thickness of the loop is smaller than the identified range, content of carbon nanotubes that form the transparent conductive layer is reduced, resulting in deterioration of condtutivity of the transparent conductive layer.

Figure 2:
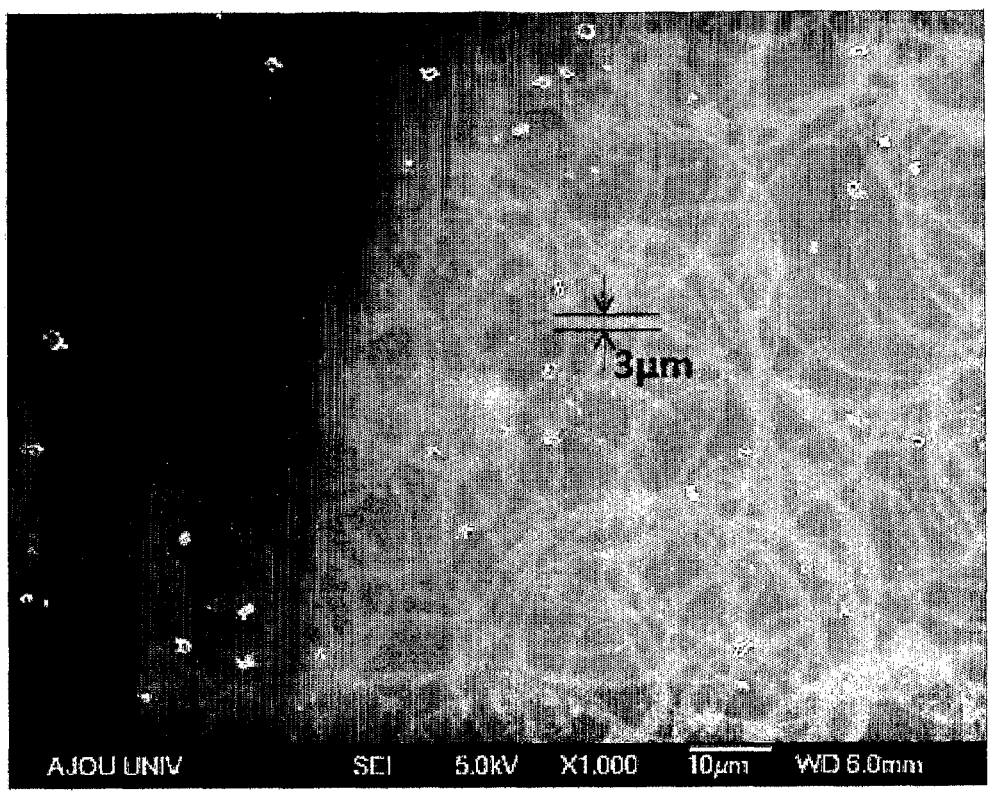
FIG. 2 is a scanning electron microscope picture of a carbon nanotube (CNT) transparent conductive layer fabricated according to an exemplary embodiment.

FIG. 2 is a scanning electron microscope (SEM) picture of a CNT transparent conductive layer fabricated according to an exemplary embodiment. Referring to FIG. 2, it can be confirmed that there is a circular loop pattern consisting of loops overlapping one another and portions of the pattern, excluding the loops overlapping portions, remain unfilled. Also it can be confirmed that the thickness of the circular loop is about 3 m, and its diameter is about 40 m.

Hereinafter, a method of fabricating a CNT transparent conductive layer in accordance with an exemplary embodiment will now be described.

First, carbon nanotubes, a dispersing agent, and solvents are mixed together and dispersed.

Although the carbon nanotubes may be single-walled carbon nanotubes, double-walled carbon nanotubes, multiwalled carbon nanotubes, or the mixture of the above nanotubes, the type of carbon nanotubes is not necessarily limited thereto.

The dispersing agents can be of any type as long as it disperse carbon nanotubes in a solvent such as water, and, for example, sodium dodecyl sulfate (SDS), triton X-100 (manufactured by Sigma Chemical Co.), Tween 20 (polyoxyethyelene sorbitan monolaurate), and CTAB (cetyl trimethyl ammonium bromide) may be used. Content of the dispersing agent may be of between 0.1 to 10000 weight parts per 1 weight part of carbon nanotubes, and more specifically, it may be advantageous if content of the dispersing agent is between 0.1 to 500 weight parts.

The solvent may be water, ethanol, isopropanol, 1,2-Dichlorobenzene, chloroform, dimethylformamide, acetone, or the mixture of the above substances, and content of the solvent may be between 10 to 80000 weight parts per 1 weight part of carbon nanotubes.

Then, the resulting substance is prepared as a coating solution. The coating solution may contain carbon nanotubes of 0.01 to 20 weight parts per the total of 100 weight parts of the coating solution.

If the coating solution contains carbon nanotubes less than 0.01 weight parts, the loop pattern created with the coating solution has an excessively thin thickness or has the connection between the loops cut off, resulting in decrease of condtutivity of a transparent electrode. Alternatively, if the coating solution contains carbon nanotubes more than 20 weight parts, the insides of loops are partially filled with the coating solution, thus causing the solution to take longer time to evaporate. As the result, the shape of the pattern becomes irregular, causing decrease of transparency of the transparent electrode.

Then, the coating solution is spray-coated on a base and is dried out.

The spray-coating technique to be used in the exemplary embodiment may be implemented by general spray coating tools and ultrasonic sprayers. Nozzles to be used for spray-coating may be in various forms, such as single-fluid, two-fluid, and a mixture of the both types.

An apparatus for evaporating the solvent in the course of spray coating processes may be employed to an exemplary embodiment. To this end, a heating plate may be used, which may apply heat to the top, sidewalls and bottom of a surface to be coated with the coating solution.

The base is heated up to a temperature the same as the temperature at which the base is thermal-processed, and is adjusted in a way to promote the efficient evaporation of the solvent which is used within a temperature range from 50 to 300° C. Also, the temperature varies according to a type of the base. If the base is heated at an excessively low temperature, evaporation of the solvent takes place slowly and the coffee-ring type loop pattern is broken off. On the contrary, if the base is heated over the temperature of 300° C., an evaporation of solvent speeds up, but the characteristics of the base may be affected.

The base used in the spray process may be glass, a polymer film, or a membrane. However, the types of the base are not limited to the above identified materials, and the coating solution can be coated evenly on a flat base.

The polymer film may be, more specifically, a polyethylene terephthalate (PET) film.

According to the exemplary embodiment, the coating solution may be sprayed at a pressure of from 0.05 kgf/cm$^2$ to 60 kgf/cm$^2$. If the coating solution is sprayed at a pressure over 60 kgf/cm$^2$, the coating solution droplets cannot form a loop pattern upon touching the base but only will be scattered over the base. Consequently, loops cannot be connected with one another, resulting in increase of the sheet resistance of a completely manufactured transparent electrode.

On the contrary, if the coating solution is sprayed at a pressure of less than 0.05 kgf/cm$^2$, spraying is not properly performed and the size of a sprayed droplet increases, so that it is difficult to coat the base with the coating solution. Therefore, a distance between spray nozzles and the base needs to be adjusted appropriately such that a pressure when the coating solution touches the base still remains the same as the pressure at which the solution is sprayed. To create stable pattern, a distance between the base and the nozzles may be from about 1 to about 100 cm.

According to the exemplary embodiment, the CNT transparent conductive layer manufactured by the above-described method has a sheet resistance of less than 20 kΩ/□ (kΩ per sq.), and more specifically, of between 10 kΩ/□ (kΩ per sq.) and 20Ω/□, (Ω per sq.) and a transparency over 60%, and more specifically, a transparency of between 60 to 98%, and thus the conductivity and transparency are significantly improved.

Hence, the CNT transparent conductive layer in accordance with the exemplary embodiment can be advantageously employed as a transparent electrode, substituting for an indum tin oxide (ITO) transparent electrode.

Further detail and advantages of the present invention will now be described below with reference to embodiments thereof, and it will be understood by those skilled in the art that the present invention is not limited to the embodiments below.

Exemplary Embodiment 1

Single-walled carbon nanotubes (SWNT) of 3.0 mg and a SDS dispersing agent of 1.5 mg are put in distilled water of 200 ml and they are evenly mixed together. The mixed material is dispersed for an hour by use of a bath sonicator (Branson 5510 at 40 kHz and 135 W), and then the dispersed material is used as a coating solution.

A polyethylene terephthalate (PET) film is used as a base. The base is placed on a heating plate heated at 70° C., and spray-coated with the coating solution by use of a spraying device (Anest Iwata W-100). Then the spray-coated base is dried out to fabricate a CNT transparent conductive layer. In this case, the coating solution is sprayed at a pressure of 5 kgf/cm$^2$.

Figure 3:
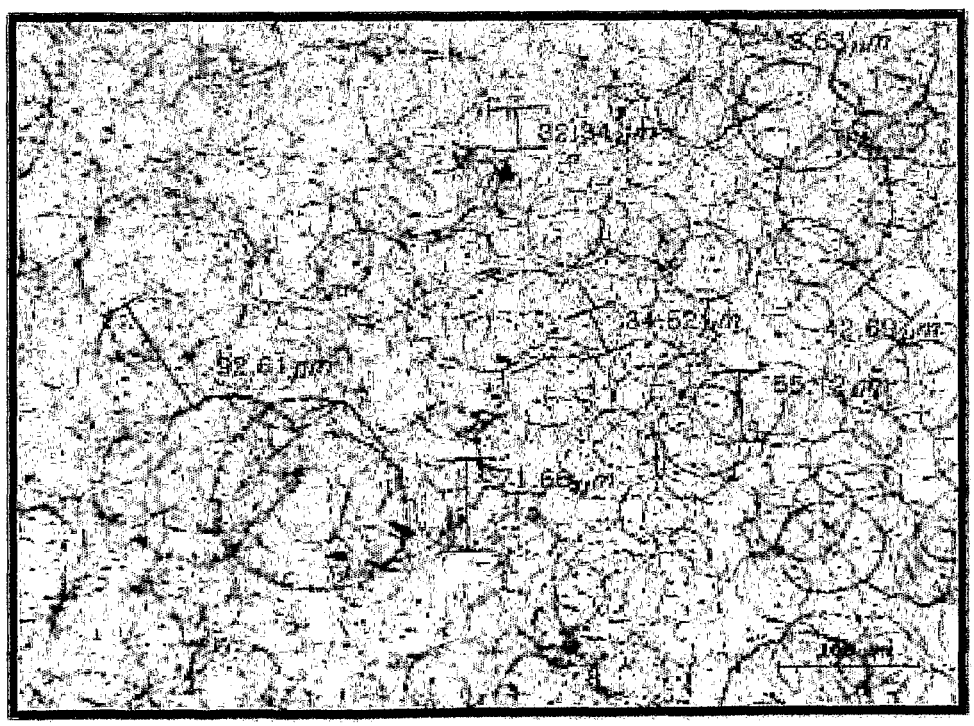
FIG. 3 is a scanning electron microscope picture of a CNT transparent conductive layer according to an exemplary embodiment 1.

The fabricated CNT transparent conductive layer is enlarged by 200 times and observed by using a microscope (OLYMPUS BX51) as shown in FIG. 3. The sheet resistance and transparency of the CNT transparent conductive layer are measured and shown in Table 1 below.

Referring to FIG. 3, loop-shaped patterns are created on the base during the spraying. The patterns are connected with one another while overlapping one another, and thus an electrical flow can take place. Accordingly, the loop pattern enables fabrication of a transparent electrode having a high transparency since the pattern has loops of which inside is partially empty.

Exemplary Embodiment 2

3.0 mg of single-walled carbon nanotubes (SWNT), 1.5 mg of a SDS dispersing agent and 200 ml of distilled water are evenly mixed together.

The mixture is dispersed for an hour by use of a bath sonicator (Branson 5510 at 40 kHz and 135 W), and then the dispersed material is used as a coating solution.

A PET film is used as a base, and the film is heated by placing it on a heating plate heated at 70° C. Then, the base is spray-coated with the coating solution by use of an ultrasonic sprayer (from Samsung Electronics) by spraying the solution at a pressure of 1 kgf/cm². Then the spray-coated base is dried up to fabricate the CNT transparent conductive layer.

Figure 4:
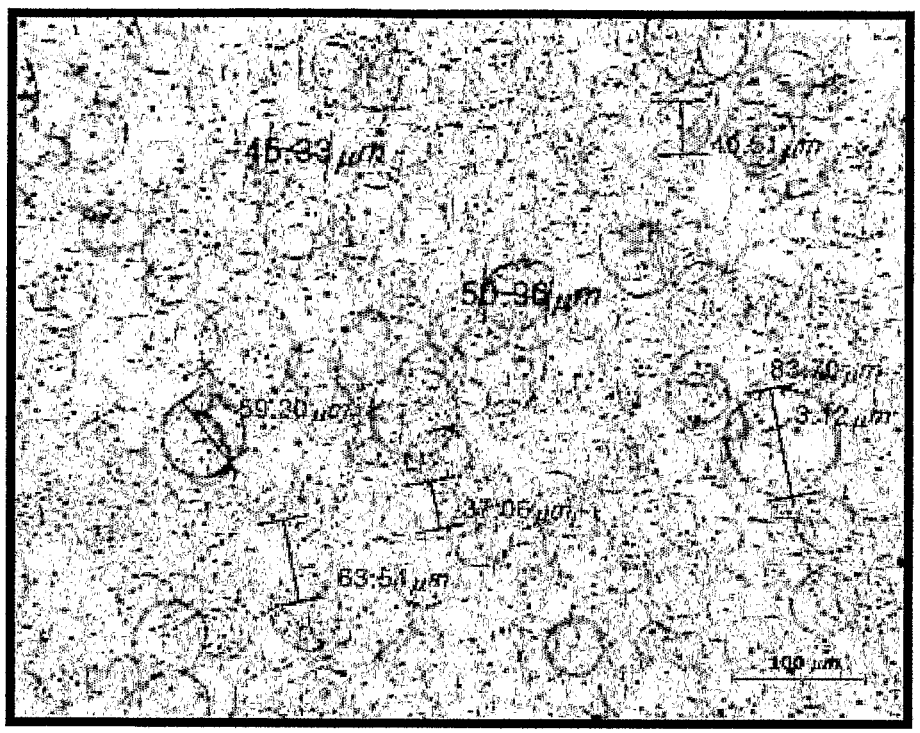
FIG. 4 is a scanning electron microscope picture of a CNT transparent conductive layer according to an exemplary embodiment 2.

The CNT transparent conductive layer fabricated in accordance with the current embodiment is enlarged by 200 times and observed, as shown in FIG. 4. The sheet resistance and transparency of the CNT transparent conductive layer are measured and listed on the Table 1 below.

Referring to FIG. 4, it can be confirmed that there are loop patterns overlapping one another and in which loops have their inside partially empty, similar to FIG. 1.

Comparative Embodiment 1

3.0 mg of single-walled carbon nanotubes (SWNT), 1.5 mg of SDS dispersing agent, and 200 ml of distilled water are evenly mixed together. The mixture is dispersed for an hour by use of a bath sonicator (Branson 5510 at 40 kHz and 135 W), and then the dispersed material is used as a coating solution.

A PET film is used as a base, and like in the embodiment 1, the base is placed on a heating plate at 70° C. The base is spray-coated with the coating solution by use of a spraying device (Anest Iwata W-100). Then the spray-coated base is dried out to fabricate a CNT transparent conductive layer. In this case, the coating solution is sprayed at a pressure of 75 kgf/cm².

Figure 5:
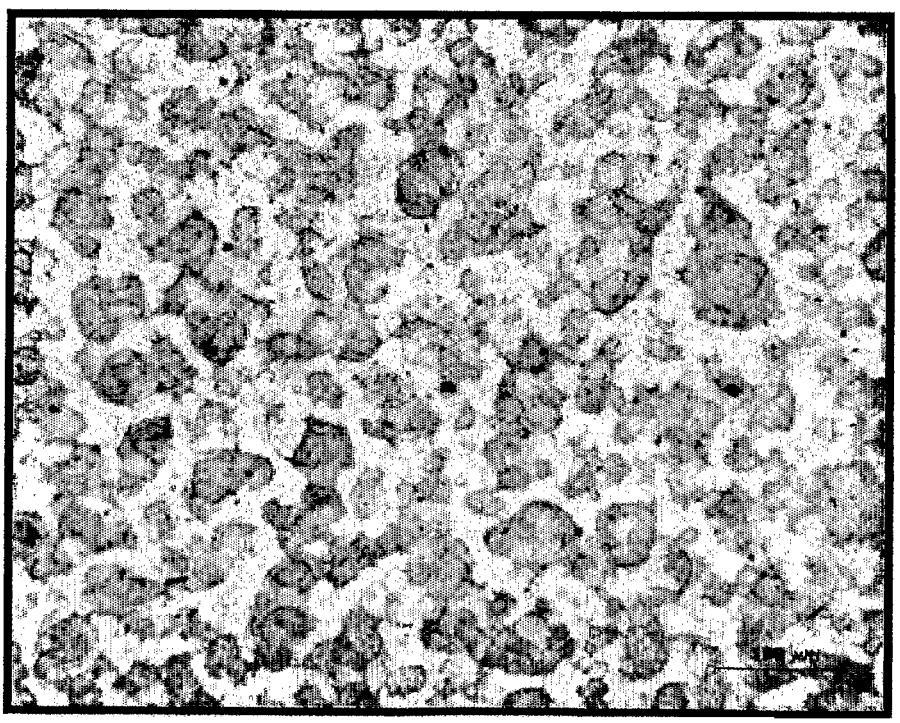
FIG. 5 is a scanning electron microscope picture of a CNT transparent conductive layer according to a comparative embodiment 1.

The CNT transparent conductive layer is enlarged by 200 times and observed by microscopy, as shown in FIG. 5. The sheet resistance and transparency of the CNT transparent conductive layer in accordance with the above procedures are measured and shown in table 1 below.

Referring to FIG. 5, a coating pattern is observed, which is obtained when a spraying pressure is raised and the other conditions are the same as the embodiment 1. As shown in FIG. 4, the patterns on the base are created in irregular shapes not in a circular shape when the coating solution is sprayed at a high pressure. Additionally, as shown in Table 1 below, the sheet resistance of the CNT transparent conductive layer in accordance with the current embodiment does not significantly increase since there are certain connections between the patterns, but the transparency decreases as the patterns are filled with the solution.

Table 1 shows spray conditions for the respective embodiments 1 and 2 and the comparative embodiment 1, and the sheet resistance and transparency of each CNT transparent conductive layer fabricated in accordance with the each embodiment.

As it can be understood with reference to Table 1, the CNT transparent conductive layer according to each of the exemplary embodiments 1 and 2 has a loop pattern, and advanced sheet resistance and transparency.

On the contrary, the CNT transparent conductive layer in accordance with the comparative embodiment has irregular shapes and a high sheet resistance, but there is a decrease of the conductivity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. A carbon nanotube (CNT) transparent conductive layer having a loop pattern comprising a plurality of loops that are at least partially connected to one another, wherein each of the plurality of loops has a wall thickness of from about 0.5 to about 5 μm and each of the plurality of loops has a diameter of from about 10 to about 120 μm.

2. The CNT transparent conductive layer of claim 1, wherein an interior of each of the plurality of loops is empty or partially filled.

3. A method of fabricating a carbon nanotube (CNT) transparent conductive layer, wherein the CNT transparent conductive layer has a loop pattern in which a plurality of loops are at least partially connected to one another, the method comprising:
   preparing a coating solution by mixing and dispersing carbon nanotubes, a dispersing agent and a solvent;
   spraying the coating solution onto a base at a pressure of from 0.05 to 60 kgf/cm²; and
   drying the coated base to produce the loop pattern, each of the plurality of loops having a wall thickness of between about 0.5 to 5 μm and a diameter of between about 10 to 120 μm.

4. The method of claim 3, wherein drying the coated base comprises heating the coated base at a temperature of from about 50 to about 300° C.

5. The method of claim 3, wherein preparing a coating solution comprises preparing a coating solution containing 0.01 to 20 weight parts of carbon nanotubes per 100 weight parts of the coating solution.

6. The method of claim 3, wherein preparing a coating solution comprises preparing a coating solution containing about 100 to 80000 weight parts of the solvent per 1 weight part of carbon nanotubes.

TABLE 1

|  | Spray condition | Pattern characteristic | Sheet resistance of transparent electrode (Ω/□) (Ω per sq.) | Transparency of transparent electrode (%) |
|---|---|---|---|---|
| Embodiment 1 | Spray pressure of 5 kgf/cm² Temperature of base 70° C. | Loop pattern | 700 | 84 |
| Exemplary Embodiment 2 | Spray pressure of 1 kgf/cm² Temperature of base 70° C. | Loop pattern | 800 | 85 |
| Comparative Embodiment 1 | Spray pressure of 75 kgf/cm² Temperature of base 70° C. | Irregular shape | 800 | 75 |

7. The method of claim 3, wherein the base is selected from a group consisting of glass, a polymer film, and a ceramic film.

8. The method of claim 3, wherein the solvent is selected from a group consisting of water, ethanol, methanol, isopropanol, 1,2-dichlorobenzene, chloroform, dimethylformamide, and acetone.

* * * * *